US009373612B1

(12) United States Patent
Huang et al.

(10) Patent No.: US 9,373,612 B1
(45) Date of Patent: Jun. 21, 2016

(54) ELECTROSTATIC DISCHARGE PROTECTION CIRCUITS AND METHODS

(71) Applicant: Altera Corporation, San Jose, CA (US)

(72) Inventors: Cheng-Hsiung Huang, Cupertino, CA (US); Kyle Bowers, Morgan Hill, CA (US)

(73) Assignee: Altera Corporation, San Jose, CA (US)

(*) Notice: Subject to any disclaimer, the term of this patent is extended or adjusted under 35 U.S.C. 154(b) by 323 days.

(21) Appl. No.: 13/907,140

(22) Filed: May 31, 2013

(51) Int. Cl.
*H02H 9/00* (2006.01)
*H01L 27/02* (2006.01)

(52) U.S. Cl.
CPC .................................. *H01L 27/0248* (2013.01)

(58) Field of Classification Search
USPC .......................................................... 361/56
See application file for complete search history.

(56) References Cited

U.S. PATENT DOCUMENTS

| | | | |
|---|---|---|---|
| 5,959,488 A * | 9/1999 | Lin ..................... | H01L 27/0251 327/313 |
| 6,144,542 A | 11/2000 | Ker et al. | |
| 6,768,619 B2 | 7/2004 | Ker et al. | |
| 6,770,918 B2 | 8/2004 | Russ et al. | |
| 6,777,721 B1 | 8/2004 | Huang et al. | |
| 6,972,593 B1 | 12/2005 | Wang et al. | |
| 7,119,579 B2 | 10/2006 | Chong et al. | |
| 7,471,493 B1 | 12/2008 | Huang et al. | |
| 7,615,417 B2 | 11/2009 | Manna et al. | |
| 7,859,804 B1 | 12/2010 | Gallerano et al. | |
| 8,064,175 B2 | 11/2011 | Poulton | |
| 2009/0021872 A1* | 1/2009 | Ker ..................... | H01L 27/0266 361/56 |
| 2011/0026175 A1* | 2/2011 | Ker ..................... | H01L 27/0262 361/56 |
| 2012/0154963 A1* | 6/2012 | Deval ..................... | H02H 9/046 361/56 |
| 2014/0126089 A1* | 5/2014 | Chang ..................... | H02H 9/046 361/56 |

FOREIGN PATENT DOCUMENTS

WO     2006001990     1/2006

OTHER PUBLICATIONS

"Operating Requirements for Altera Devices," Data Sheet, Altera Corporation, Dec. 1999, ver. 9.02, pp. 1-14.
Ming-Dou Ker, and Wei-Jen Chang, "ESD Protection Design With On-Chip ESD Bus and High-Voltage-Tolerant ESD Clamp Circuit for Mixed-Voltage I/O Buffers," IEEE Transactions on Electron Devices, vol. 55, No. 6, Jun. 2008, pp. 1409-1416.

* cited by examiner

*Primary Examiner* — Ronald W Leja
(74) *Attorney, Agent, or Firm* — Steven J. Cahill

(57) ABSTRACT

An electrostatic discharge (ESD) protection circuit includes an electrostatic discharge bus, first and second resistors coupled in series, first and second capacitors coupled in series, and first and second transistors. The first resistor is coupled to the electrostatic discharge bus. The first capacitor is coupled to the second resistor. The first transistor has a control input that is coupled between the first and the second resistors. The second transistor has a control input that is coupled between the first and the second capacitors.

20 Claims, 7 Drawing Sheets

ELECTROSTATIC DISCHARGE PROTECTION CIRCUITS AND METHODS

TECHNICAL FIELD

The present disclosure relates to electronic circuits, and more particularly, to electrostatic discharge (ESD) protection circuits and methods.

BACKGROUND

An electrostatic discharge (ESD) event is a sudden flow of electricity between two circuits that is caused by contact, an electrical short, or breakdown. An ESD event can occur at a pin of an integrated circuit when the integrated circuit is handled by a person or machine. An ESD event can cause damage to, and possibly the failure of, an integrated circuit. An integrated circuit that contains field-effect transistors (FETs) having thin gate oxide regions cannot tolerate high gate voltages. If the integrated circuit experiences a high voltage ESD event at one of its input pins, the field-effect transistors in the input buffer coupled to that input pin may experience breakdown.

BRIEF SUMMARY

According to some embodiments, an electrostatic protection circuit includes an electrostatic discharge bus, first and second resistors coupled in series, first and second capacitors coupled in series, and first and second transistors. The first resistor is coupled to the electrostatic discharge bus. The first capacitor is coupled to the second resistor. The first transistor has a control input that is coupled between the first and the second resistors. The second transistor has a control input that is coupled between the first and the second capacitors.

According to other embodiments, an integrated circuit includes a first transistor having a gate terminal coupled to a supply voltage pin. A drain of the first transistor is coupled to first and second capacitors. A second transistor has a gate terminal coupled to a source of the first transistor. A source of the second transistor is coupled to a second pin. A diode has an anode coupled to the source of the second transistor and a cathode coupled to a drain of the second transistor. An input circuit is coupled to the drain of the second transistor. The diode conducts current from the second pin to the input circuit during an electrostatic discharge event at the second pin.

According to further embodiments, a circuit includes an electrostatic discharge bus, a resistor coupled to the electrostatic discharge bus, a capacitor, a first transistor coupled to the resistor, a second transistor coupled to the capacitor and the first transistor, and third and fourth transistors. The third transistor is coupled to the electrostatic discharge bus and to the fourth transistor. A hot socket protection circuit includes fifth and sixth transistors coupled in series. The fifth transistor is coupled to the first, the second, and the fourth transistors. The fifth and the sixth transistors turn on in response to a hot socket signal to turn off the third and the fourth transistors.

Various objects, features, and advantages of the present invention will become apparent upon consideration of the following detailed description and the accompanying drawings.

DETAILED DESCRIPTION

Figure 1:
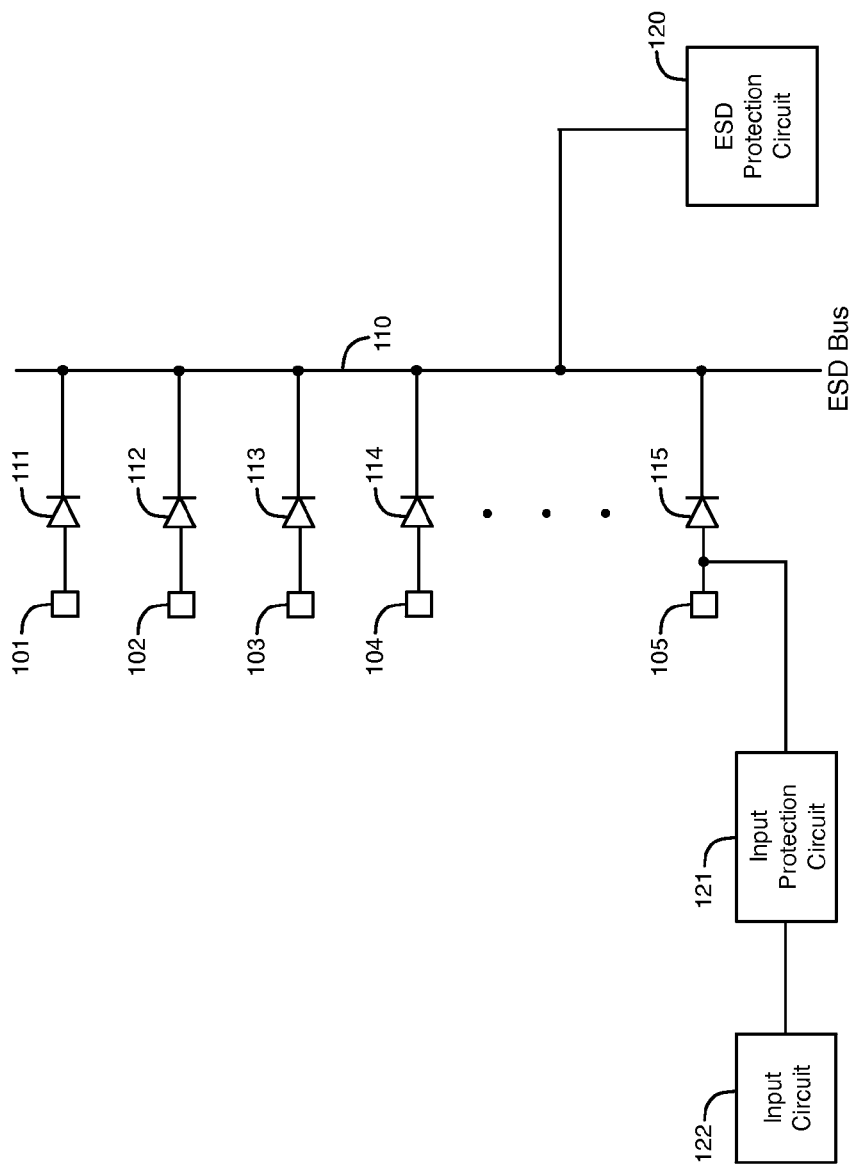
FIG. 1 illustrates an example of an electrostatic discharge (ESD) bus, according to an embodiment of the present invention.

FIG. 1 illustrates an example of an electrostatic discharge (ESD) bus 110, according to an embodiment of the present invention. FIG. 1 also illustrates input and/or output (IO) pins 101-105, diodes 111-115, ESD protection circuit 120, input protection circuit 121, and input circuit 122. All of the circuitry shown in FIG. 1 is in an integrated circuit. Each of IO pins 101-105 is an external terminal of the integrated circuit. IO pins 101-105 may be conductive areas on the surface of the integrated circuit. Input/output (IO) pins as described herein may also be referred to as input/output pads, or simply as pins. Input signals, output signals, and supply voltages are transmitted between the integrated circuit and external devices through the pins. The integrated circuit may be, for example, a programmable logic integrated circuit or an application specific integrated circuit.

Diodes 111-115 are coupled between pins 101-105, respectively, and the ESD bus 110 as shown in FIG. 1. Five pins and five diodes are shown in FIG. 1 merely as an example. The integrated circuit may also include several other pins and a corresponding number of diodes coupled to the pins. The cathode of each diode is coupled to ESD bus 110, and the anode of each diode is coupled to a corresponding pin.

ESD bus 110 contains a conductive material in the integrated circuit. ESD bus 110 may, for example, be formed by a wide metal line. ESD bus 110 may have multiple conductive branches that connect to other circuits in the integrated circuit. In an exemplary embodiment, ESD bus 110 is coupled to each IO pin in the integrated circuit through a diode. As an example, if IO pins are near each of the four edges of the integrated circuit, ESD bus 110 is routed around the integrated circuit die near each of its four edges.

Figure 4:
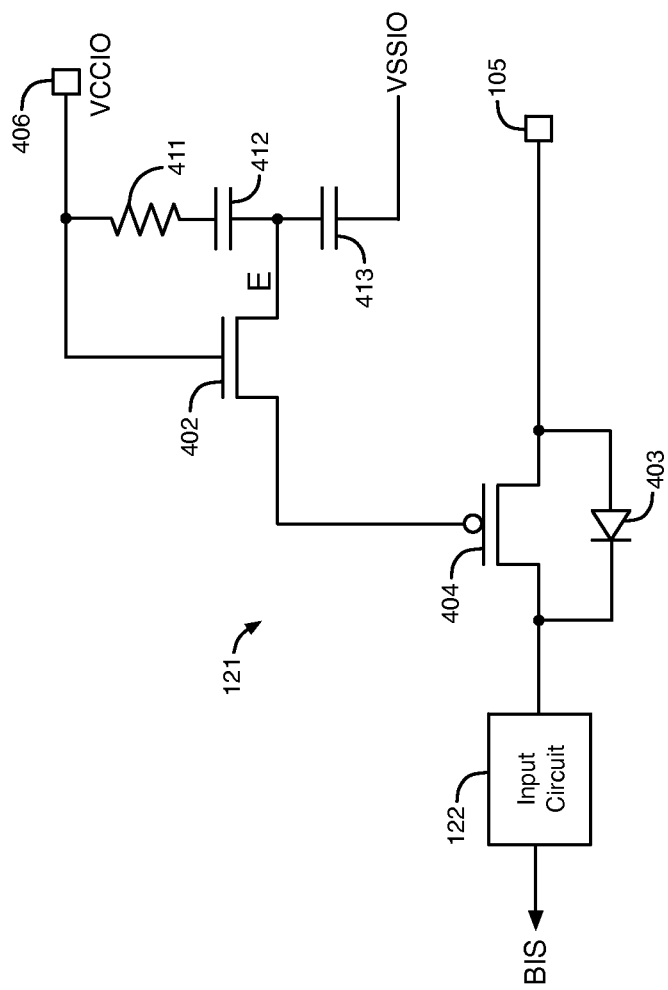
FIG. 4 illustrates an example of the input protection circuit shown in FIG. 1, according to an embodiment of the present invention.

Input protection circuit 121 is coupled to pin 105 as shown in FIG. 1. Input protection circuit 121 is also coupled to input circuit 122. An input signal received at pin 105 is provided through input protection circuit 121 to input circuit 122. Input protection circuit 121 protects input circuit 122 from ESD voltages on pin 105, as described in further detail below with respect to FIG. 4. According to various embodiments, additional input protection circuits having the same circuit architecture shown in FIG. 4 are coupled between other input pins and other input circuits in the integrated circuit.

Figure 2:
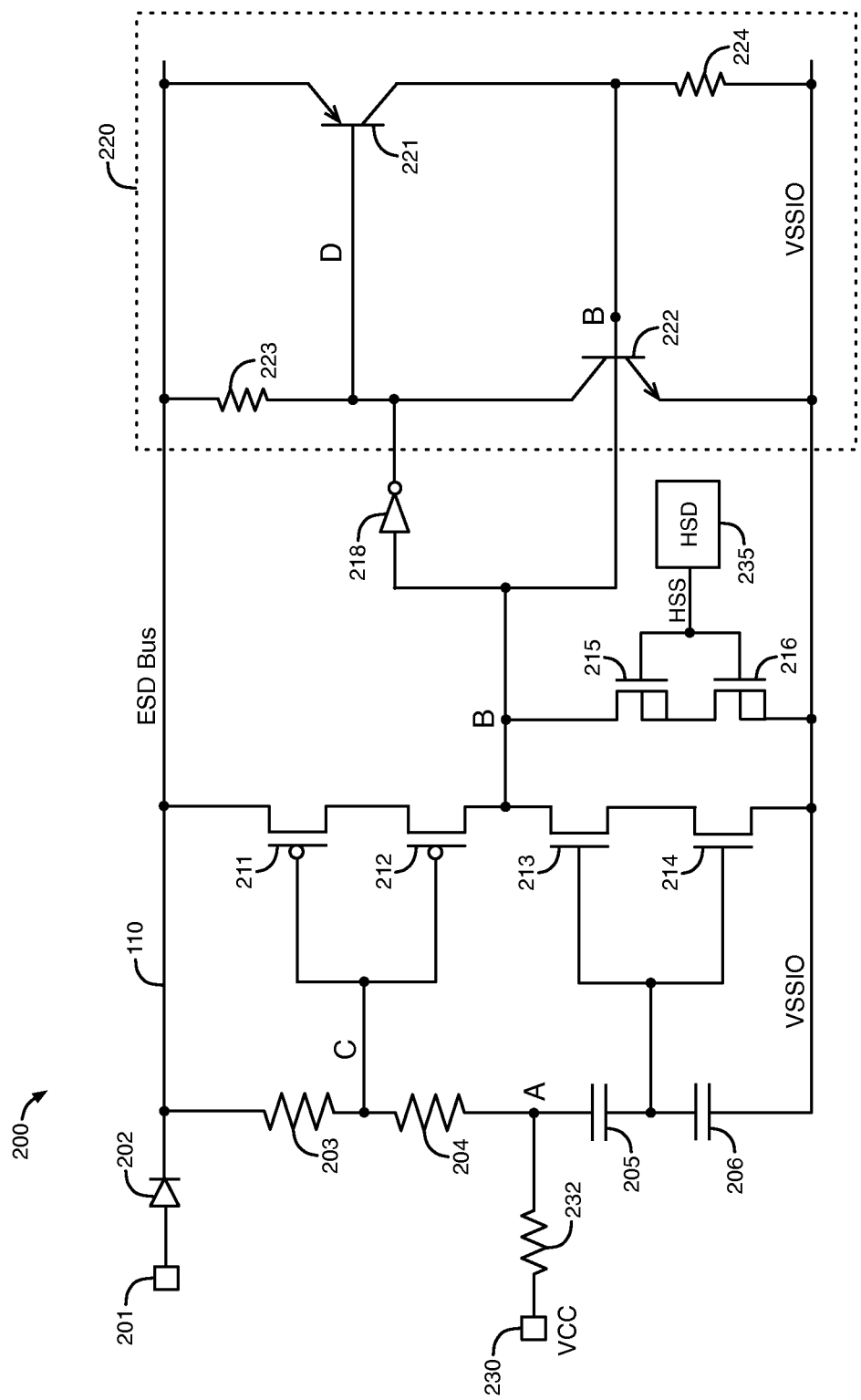
FIG. 2 illustrates an example of an electrostatic discharge (ESD) protection circuit, according to an embodiment of the present invention.

FIG. 2 illustrates an example of an electrostatic discharge (ESD) protection circuit 200, according to an embodiment of the present invention. ESD protection circuit 200 shown in FIG. 2 is an example of ESD protection circuit 120. ESD protection circuit 200 includes resistors 203-204 and 232, capacitors 205-206, p-channel metal-oxide semiconductor field-effect transistors (MOSFETs) 211-212, n-channel MOSFETs 213-216, inverter circuit 218, resistors 223-224, PNP bipolar junction transistor (BJT) 221, and NPN BJT 222. Inverter circuit 218 has bipolar junction transistors.

ESD protection circuit 200 is coupled to ESD bus 110. ESD protection circuit 200 is coupled to the cathode of diode 202 through ESD bus 110. The anode of diode 202 is coupled to an input/output pin 201. Pin 230 is a supply voltage pin. Resistor 232 is coupled between pin 230 and node A.

In an embodiment, field-effect transistors 211-216 are input/output (IO) transistors that tolerate a relatively high voltage (e.g., up to 2 volts). The sources of transistors 214 and 216 are coupled to a node at a ground voltage VSSIO (i.e., zero volts). Resistors 203-204 and 232 may be passive resistors or transistors coupled to function as resistors. Capacitors 205-206 may be, for example, passive capacitors or transistors that are coupled to function as capacitors.

Figure 3:
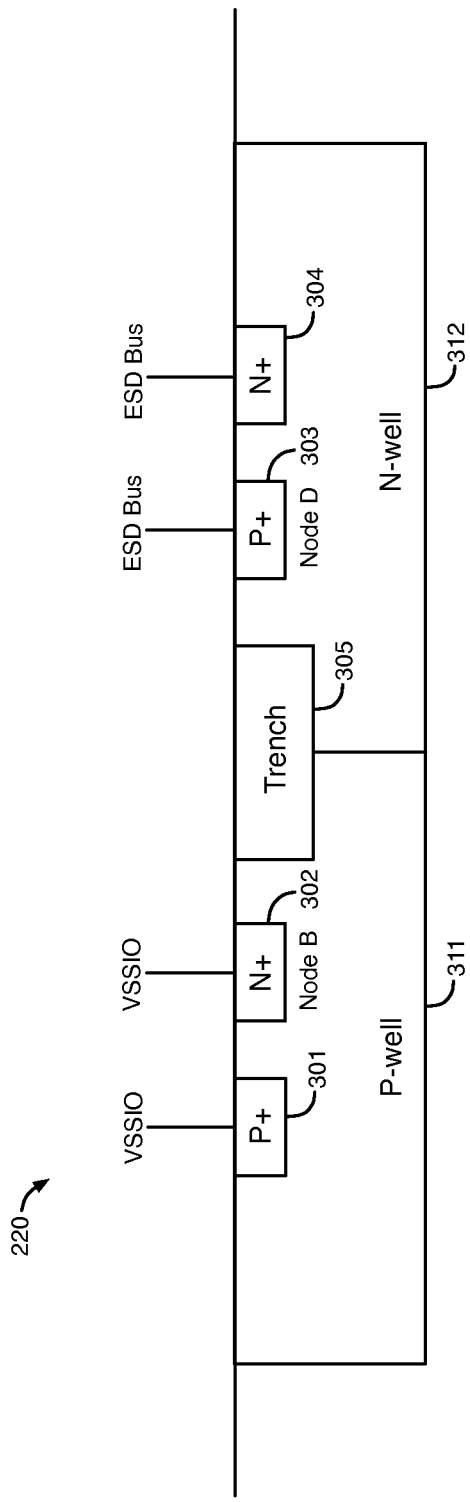
FIG. 3 illustrates a cross-sectional view of an example of the silicon-controlled rectifier circuit shown in FIG. 2, according to an embodiment of the present invention.

Resistors 223-224 and BJTs 221-222 are a silicon-controlled rectifier (SCR) circuit 220. FIG. 3 illustrates a cross-sectional view of an example of SCR circuit 220, according to an embodiment of the present invention. As shown in FIG. 3, SCR circuit 220 includes a p-type contact region 301, an n-type contact region 302, a p-type contact region 303, an n-type contact region 304, a trench isolation region 305, a p-well region 311, and an n-well region 312. The p-type contact region 301 and the n-type contact region 302 are formed in p-well 311. The p-type contact region 303 and the n-type contact region 304 are formed in n-well 312.

N-type contact region 302, p-well 311, and n-well 312 form the n-type, p-type, and n-type regions, respectively, of NPN BJT 222. P-type contact region 303, n-well 312, and p-well 311 form the p-type, n-type, and p-type regions, respectively, of PNP BJT 221. Resistor 224 is a parasitic resistor in p-well 311 between p-type contact 301 and B node below n-type contact 302. Resistor 223 is a parasitic resistor in n-well 312 between node D below p-type contact 303 and n-type contact 304.

The emitter of BJT 221 is coupled to ESD bus 110. The emitter of BJT 222 is coupled to a ground voltage node at VSSIO. The base of PNP BJT 221 in n-type well 312 at node D is the collector of NPN BJT 222. The base of NPN BJT 222 in p-type well 311 at node B is the collector of PNP BJT 221.

An ESD event can occur at a pin of an integrated circuit during handling of the integrated circuit before the integrated circuit has been plugged into a power source. Before an ESD event, the voltage at pin 230 is floating or grounded, because the integrated circuit has not yet powered up, and a supply voltage is not applied to pin 230. When an ESD event occurs at pin 201 shown in FIG. 2, the voltage on pin 201 increases rapidly to a high voltage (e.g., greater than 2 volts). During an ESD event on pin 201, current flows from pin 201 through diode 202, ESD bus 110, and ESD protection circuit 200. During the ESD event, current flows from pin 201 through diode 202, ESD bus 110, resistors 203-204, and capacitors 205-206. Because the current flow through ESD protection circuit 200 increases rapidly during an ESD event at pin 201, capacitors 205-206 are shorted to ground. Therefore, the gate terminals of n-channel transistors 213-214 are at or near the ground voltage VSSIO during the ESD event, and n-channel transistors 213-214 are off.

During an ESD event at pin 201, the voltage on ESD bus 110 is a diode voltage drop below the ESD voltage at pin 201, and the remaining ESD voltage at pin 201 is dropped across resistors 203 and 204. Resistors 203 and 204 have equal resistance values. Therefore, half of the remaining ESD voltage at pin 201 is dropped across resistor 203, and half of the remaining ESD voltage at pin 201 is dropped across resistor 204. The gate terminals of p-channel transistors 211-212 are coupled between resistors 203-204 at node C, so that the gate terminals of p-channel transistors 211-212 only receive half of the voltage drop between ESD bus 110 and voltage VSSIO during an ESD event at pin 201.

For example, if the ESD voltage at pin 201 is 2.2 volts, and the voltage drop across diode 202 is 1 volt during the ESD event, then the voltage on ESD bus 110 is 1.2 volts, and the voltage at node C is 0.6 volts. In this example, the voltage drop from ESD bus 110 to node C is 0.6 volts, which is a small enough voltage not to cause breakdown in transistors 211-212. However, the voltage drop from node C to ESD bus 110 is equal to or less than the gate-to-source threshold voltages of transistors 211-212 (e.g., –0.3 volts) during an ESD event at pin 201. The sources and the drains of PMOS transistors 211-212 are at or near the voltage of ESD bus 110. Thus, the voltage drop from the gate to the source of each of the PMOS transistors 211-212 during an ESD event at pin 201 turns both of p-channel transistors 211-212 on.

When p-channel transistors 211-212 are on, current flows from ESD bus 110 through transistors 211-212 to node B. Because n-channel transistors 213-214 are off during an ESD event at pin 201, transistors 211-212 charge up the voltage at node B from voltage VSSIO to at or near the voltage on the ESD bus 110. The voltage on the ESD bus 110 and at node B (i.e., greater than 0.7 volts) is large enough to cause NPN BJT 222 to be on during an ESD event at pin 201. Inverter 218 discharges node D to the ground voltage in response to the voltage on node B during the ESD event at pin 201. PNP BJT 221 turns on in response to the voltage at its base at node D discharging to the ground voltage during the ESD event at pin 201.

SCR circuit 220 is on when both of transistors 221-222 are on. When SCR circuit 220 is on during an ESD event, current flows from ESD bus 110 through SCR circuit 220 to the node at ground voltage VSSIO. Thus, SCR circuit 220 discharges the ESD bus 110 during an ESD event.

The increasing collector current through BJT 222 reduces the base voltage of BJT 221 at node D, increasing the collector current through BJT 221. The increasing collector current through BJT 221 increases the base voltage of BJT 222 at node B, increasing the collector current through BJT 222. BJTs 221-222 use positive feedback to increase their collector currents, which reduces the voltage on the ESD bus 110. SCR circuit 220 uses positive feedback to clamp the voltage on the ESD bus 110 to a relatively low voltage (e.g., 1.2 volts) by sinking current from ESD bus 110 to the node at VSSIO. Because SCR circuit 220 clamps the voltage on ESD bus 110 to a low voltage during an ESD event, transistors that cannot tolerate high voltages, such as transistors 211-216, can be used in ESD protection circuit 200 without breaking down.

If the ESD voltage at pin 201 increases above 2.2 volts during an ESD event, then the voltage drop across diode 202 increases above 1 volt, and the current through diode 202 and SCR circuit 220 increases to maintain a low voltage (e.g., about 1.2 volts) on ESD bus 110. SCR circuit 220 prevents pin 201 and ESD bus 110 from reaching a high voltage that could damage the input and output circuits on the integrated circuit that are coupled to the input/output pins. After an ESD event at pin 201 is over, the current through resistors 203-204 and capacitors 205-206 decreases to zero, and the current through SCR circuit 220 decreases to zero after SCR circuit 220 discharges ESD bus 110.

The voltage at node B is charged up to the voltage of ESD bus 110, as described above, during an ESD event. The voltage at node B is clamped to about 1.2 volts during an ESD event and does not break down the gate of NMOS transistor 213 when transistor 213 turns off due to its gate being at voltage VSSIO during an ESD event.

After the integrated circuit that contains circuit 200 is connected to a power source, the integrated circuit powers up. A core supply voltage VCC is applied to pin 230 when the integrated circuit is connected to a power source. Normal operation occurs when the integrated circuit is powered up, and the supply voltage VCC at pin 230 has reached its nominal operating voltage. ESD events at the pins of the integrated circuit typically do not occur during normal operation.

If an ESD event occurs at the supply voltage pin 230 prior to normal operation, and the rapidly increasing ESD voltage at pin 230 were applied directly to node A, the current through capacitors 205-206 may be large enough to damage capacitors 205-206. A resistor 232 is coupled between pin 230 and node A at capacitor 205 to reduce the current through capacitors 205-206 during an ESD event at pin 230.

The resistance of resistor 232 is selected to reduce the current through capacitors 205-206 enough to prevent damage to capacitors 205-206 during an ESD event at pin 230 having an expected ESD voltage. As an example that is not intended to be limiting, the resistance of each of resistors 203-204 is 100 kilohms, the resistance of resistor 232 is about 100 megaohms, and the capacitance of each of capacitors 205-206 is 1.0 picofarad, which limits the current through capacitors 205-206 to 20 microamps during a 2000 volt ESD voltage at pin 230 initially until a power clamp circuit (not shown) for supply voltage VCC turns on.

During an ESD event at pin 230, the voltage on the ESD bus 110 is floating, because the voltage at pin 201 is at or near the ground voltage. The charge generated on pin 230 during an ESD event at pin 230 discharges to ground through a power clamp circuit (not shown).

The resistance of resistor 203 equals the resistance of resistor 204. The capacitance of capacitor 205 equals the capacitance of capacitor 206. During normal operation, both capacitors 205-206 charge to half of supply voltage VCC. Nodes A and C and ESD bus 110 charge to supply voltage VCC. The difference between the voltage on ESD bus 110 and the voltage at node C between resistors 203 and 204 maintains p-channel transistors 211-212 off during normal operation.

During normal operation, the voltage at node A is charged to at or near supply voltage VCC. The capacitance of capacitor 205 equals the capacitance of capacitor 206, and the voltage across capacitor 206 at the gate terminals of n-channel transistors 213-214 equals about one-half of supply voltage VCC (i.e., VCC/2). When the gate terminals of n-channel transistors 213-214 are at voltage VCC/2, transistors 213-214 are on. When transistors 213-214 are on, and transistors 211-212 are off during normal operation, transistors 213-214 discharge node B to at or near the ground voltage VSSIO.

The gate terminals of n-channel transistors 213-214 are coupled between capacitors 205-206, so that each of n-channel transistors 213-214 only receives half of the supply voltage VCC at its gate terminal during normal operation. Transistors 213-214 can withstand the voltage at their gate terminals without breaking down. In some embodiments, both of transistors 213-214 can receive supply voltage VCC (e.g., less than 0.9 volts) at their gate terminals without breakdown.

When the base of NPN BJT 222 at node B is at ground voltage VSSIO during normal operation, NPN BJT 222 is off and does not conduct current. Also, when node B is at ground voltage VSSIO, inverter circuit 218 charges node D to the supply voltage received by the inverter circuit 218. Inverter circuit 218 is powered by the voltage on ESD bus 110 so that inverter circuit 218 functions during both an ESD event and normal operation. Thus, the voltage on ESD bus 110 is provided as a supply voltage to inverter circuit 218. The transistors in inverter circuit 218 are bipolar junction transistors that do not break down during an ESD event or during normal operation. When node D is charged to the supply voltage received by inverter circuit 218, and NPN BJT 222 is off, PNP BJT 221 is off and does not conduct current, and as a result, SCR circuit 220 is off. SCR circuit 220 does not draw current from ESD bus 110 to the node at voltage VSSIO when SCR circuit 220 is off. Thus, SCR circuit 220 does not draw leakage current during normal operation.

Plugging in an electrical subsystem into active hardware that has been powered up can cause hot-socketing. Contention may occur when an electrical subsystem is hot-socketed. When an electrical subsystem is hot-socketed, the logic levels often appear at the electrical subsystem's logic devices before the power supply can provide current to the supply voltage and ground grids of the subsystem board. For example, an integrated circuit in an electrical subsystem may experience significant voltages (e.g., 2 volts or greater) at one or more of its input/output pins when the supply voltage of the integrated circuit is still at or near zero volts. The voltage appearing at an input/output pin during hot-socketing may cause an ESD event.

A hot socket condition occurs when a pin (e.g., pin 201) receives a signal before the system including the integrated circuit is powered up. ESD protection circuit 200 includes a hot socket protection circuit. The hot socket protection circuit includes re-channel input/output (IO) transistors 215-216. IO transistors are used for avoiding oxide breakdown during an ESD event when the voltage at node B rises to about 1.2 volts. N-channel transistors 215-216 are coupled in series between node B and the node at voltage VSSIO. The bulk terminal of each of transistors 215-216 is coupled to its respective source terminal. The gate terminals of transistors 215-216 are coupled to receive a hot socket signal HSS from a hot socket detect (HSD) circuit 235.

Examples of hot socket detect circuits are disclosed in commonly-assigned U.S. Pat. No. 6,972,593, issued Dec. 6, 2005, and U.S. Pat. No. 7,119,579, issued Oct. 10, 2006, which are incorporated by reference herein in their entireties. The hot socket detect circuit 235 detects when a hot socket condition occurs in the integrated circuit that contains ESD protection circuit 200. When hot socket detect circuit 235 detects a hot socket condition, hot socket detect circuit 235 asserts the HSS signal to a logic high state. For example, hot socket detect circuit 235 may assert the HSS signal by driving the HSS signal to the supply voltage of the core circuitry of the integrated circuit (e.g., less than 0.9 volts).

During a hot socket condition, the voltage at pin 230 is at or near the ground voltage VSSIO. N-channel transistors 213-214 are off, because their gate-to-source voltages are at or near zero volts. P-channel transistors 211-212 may be on or off during a hot socket condition. In response to the HSS signal being asserted to a logic high state during a hot socket condition, n-channel transistors 215-216 turn on. When transistors 215-216 are on, transistors 215-216 discharge node B to ground voltage VSSIO. When node B is at ground voltage VSSIO, SCR circuit 220 is off, as described above. SCR circuit 220 only turns on to discharge the ESD bus 110 during an ESD event.

FIG. 4 illustrates an example of the input protection circuit 121 shown in FIG. 1, according to an embodiment of the present invention. Input protection circuit 121 protects input circuit 122 from a high voltage during an ESD event at pin 105. According to some embodiments, additional input protection circuits 121 having the same circuit structure shown in FIG. 4 are coupled between other pins in the integrated circuit and their corresponding input circuits.

As shown in FIG. 4, input protection circuit 121 includes n-channel MOSFET 402, diode 403, p-channel MOSFET 404, resistor 411, and capacitors 412-413. In an embodiment, diode 403 is not an internal diode inside the structure of p-channel transistor 404. Input circuit 122 may be, for example, an input buffer circuit that buffers an input signal received at pin 105 during normal operation to generate a buffered input signal BIS. The buffered input signal BIS is provided to the core circuitry of the integrated circuit.

The drain of transistor 402 is coupled between capacitors 412 and 413 at node E, and the source of transistor 402 is coupled to the gate terminal of p-channel transistor 404. Diode 403 is coupled between the drain and the source of transistor 404. The anode of diode 403 is coupled to pin 105, and the cathode of diode 403 is coupled to input circuit 122.

During normal operation, a supply voltage VCCIO is provided to the gate terminal of n-channel transistor 402 from supply voltage pin 406. Supply voltage VCCIO may be a supply voltage for the input/output circuitry of the integrated circuit. In an embodiment, supply voltage VCCIO is greater than supply voltage VCC. Before the integrated circuit is powered up, an ESD event may occur at one or more input/output pins of the integrated circuit, as described above. During an ESD event at pin 105, the voltage at the gate terminal of transistor 402 is floating or at the ground voltage, because the integrated circuit has not yet been connected to a power source.

When the voltage at the gate terminal of transistor 402 is at the ground voltage or floating, n-channel transistor 402 is off, the gate voltage of p-channel transistor 404 is floating, and p-channel transistor 404 is off. During an ESD event at pin 105, the ESD voltage at pin 105 increases rapidly from zero volts to a higher voltage, and p-channel transistor 404 remains off. Current flows from pin 105 through diode 403 to input circuit 122 during the ESD event. The voltage drop across diode 403 reduces the ESD voltage that is received at input circuit 122 from pin 105 during the ESD event. ESD protection circuit 200 causes the voltage at pin 105 to be clamped to a relatively low voltage, as described above. As an example, if the ESD voltage on pin 105 is at 2.2 volts during an ESD event, and the voltage drop across diode 403 rises to 1 volt, then the input circuit 122 receives a voltage of 1.2 volts at the cathode of diode 403.

Supply voltage VCCIO is applied to pin 406 during normal operation. Prior to the integrated circuit being powered up, the voltage at pin 406 is at the ground voltage. During an ESD event at pin 406, the ESD voltage at pin 406 increases rapidly from zero volts to a higher voltage. If an ESD event occurs at pin 406 prior to normal operation, and the rapidly increasing ESD voltage at pin 406 were applied directly to capacitors 412-413, the current through capacitors 412-413 may be large enough to damage capacitors 412-413. A resistor 411 is coupled between pin 406 and capacitor 412 to reduce the current through capacitors 412-413 during an ESD event at pin 406. The resistance of resistor 411 is selected to reduce the current through capacitors 412-413 enough to prevent damage to capacitors 412-413 during an ESD event at pin 406 having an expected ESD voltage.

During an ESD event at pin 406, n-channel transistor 402 turns on. When transistor 402 is on, transistor 402 discharges the gate terminal of p-channel transistor 404, turning p-channel transistor 404 on. However, the voltage at pin 105 is either floating or at the ground voltage, because the input/output pins of the integrated circuit have not yet been connected to receive input signals. During an ESD event, a high pin voltage does not occur at both pin 406 and at an input/output pin. Therefore, input circuit 122 is not exposed to a voltage greater than its tolerance range from pin 105 through transistor 404 during an ESD event at pin 406. During an ESD event at pin 406, the power clamp circuit (not shown) discharges pin 406.

During normal operation, the supply voltage VCCIO at pin 406 is charged up to its nominal operating voltage, which causes n-channel transistor 402 to be on. The supply voltage VCCIO is dropped across capacitors 412-413, and the voltage at node E between capacitors 412-413 is one-half of supply voltage VCCIO (i.e., VCCIO/2). The voltage between the gate of transistor 402 and the drain of transistor 402 at node E is VCCIO/2 during normal operation. Transistor 402 is selected to tolerate a gate-to-drain voltage of at least VCCIO/2.

When transistor 402 is on in normal operation, transistor 402 charges the gate terminal of p-channel transistor 404 to VCCIO/2. P-channel transistor 404 is on during normal operation when the voltage at pin 105 is equal to or greater than VCCIO/2 plus the absolute value of the threshold voltage of transistor 404.

When the voltage at pin 105 rises high enough to turn on transistor 404 during normal operation, current flows from pin 105 through the channel of transistor 404 to the input of input circuit 122. Transistor 404 has a low drain-to-source resistance. Therefore, input circuit 122 receives the full voltage of the input signal received at pin 105 during normal operation through transistor 404. Input circuit 122 is a high voltage tolerant circuit that can withstand the maximum expected voltage at pin 105 during normal operation.

In an embodiment, supply voltage VCCIO is the maximum voltage applied to pin 105 during normal operation. In this embodiment, the voltage between the source of transistor 404 at pin 105 and the gate of transistor 404 has a maximum value of VCCIO/2 during normal operation. Therefore, transistor 404 is selected to tolerate a source-to-gate voltage of at least VCCIO/2.

Figure 5:
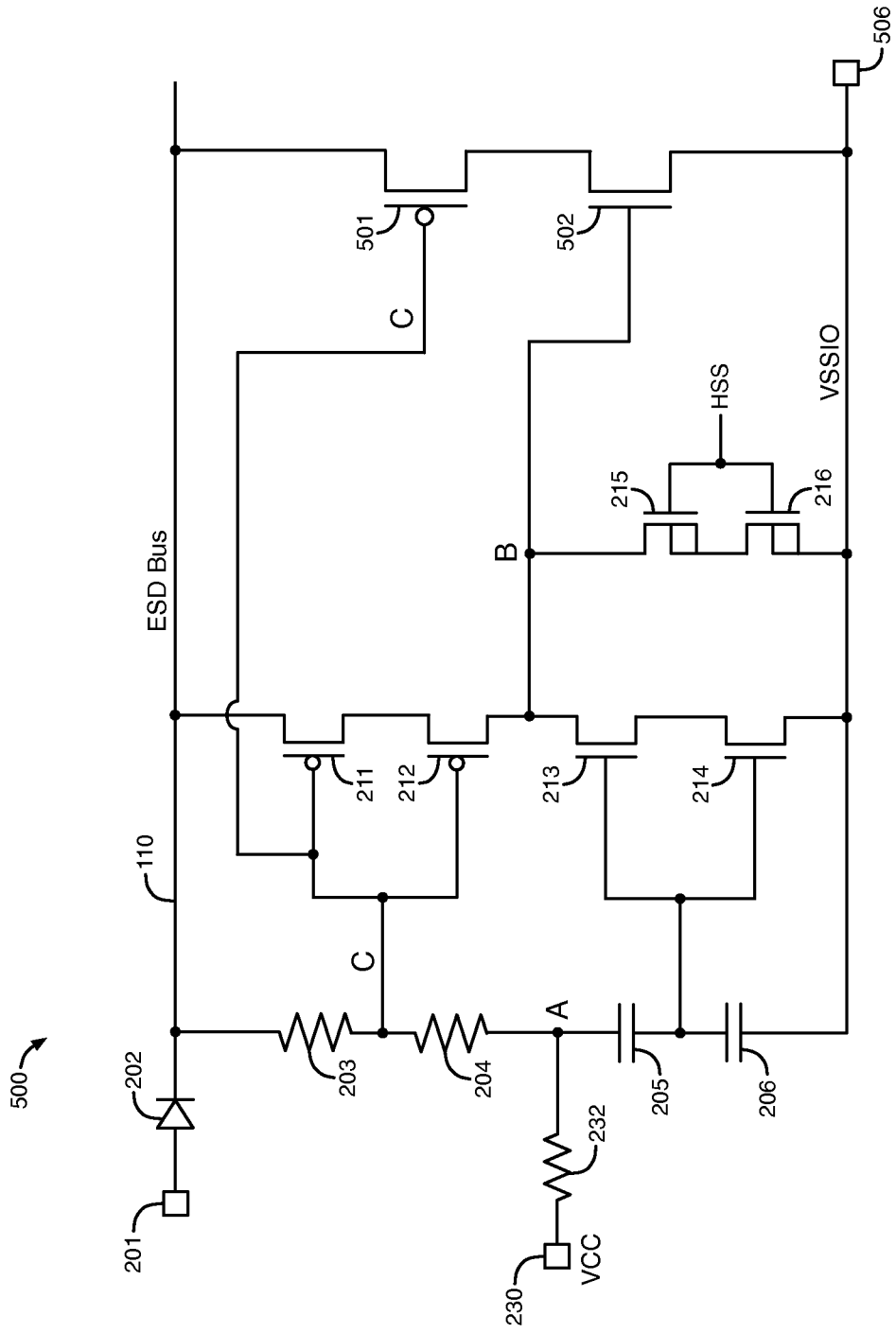
FIG. 5 illustrates another example of an electrostatic discharge (ESD) protection circuit, according to an alternative embodiment of the present invention.

FIG. 5 illustrates another example of an electrostatic discharge (ESD) protection circuit, according to an alternative embodiment of the present invention. ESD protection circuit 500 shown in FIG. 5 is an example of ESD protection circuit 120 shown in FIG. 1. ESD protection circuit 500 includes resistors 203-204 and 232, capacitors 205-206, p-channel MOSFETs 211-212, n-channel MOSFETs 213-216, p-channel MOSFET 501, and n-channel MOSFET 502. Transistors 501-502 replace SCR circuit 220 in the embodiment of FIG. 5. Transistors 501-502 clamp the voltage on the ESD bus 110 during an ESD event at pin 201.

Transistors 501-502 are coupled between ESD bus 110 and the node at the ground voltage VSSIO. ESD protection circuit 500 is coupled to ESD bus 110. ESD protection circuit 500 is coupled to the cathode of diode 202 through ESD bus 110. The anode of diode 202 is coupled to input/output pin 201. Transistors 215-216 turn on during a hot socket condition, as described above, turning off transistor 502. A ground voltage pin 506 is coupled to the VSSIO node in the embodiment of FIG. 5.

During an ESD event at pin 201, current flows from pin 201 through diode 202 to ESD protection circuit 500. P-channel transistors 211-212 turn on, and n-channel transistors 213-214 are off during the ESD event at pin 201, as described above with respect to FIG. 2. Current flows from pin 201 through diode 202, ESD bus 110, and transistors 211-212 to node B, causing the voltage at node B to charge up from voltage VSSIO to at or near the voltage on ESD bus 110.

The voltage at node B is large enough to turn on n-channel transistor 502 during an ESD event at pin 201. The voltage at node C is one-half of the voltage on ESD bus 110 during an ESD event at pin 201, because resistors 203-204 have equal resistances, and the voltage at node A is at or near VSSIO. The gate-to-source voltage drop across p-channel transistor 501 between node C and ESD bus 110 is small enough to turn on transistor 501 during an ESD event at pin 201.

When transistors 501-502 are on during the ESD event at pin 201, transistors 501-502 discharge the ESD bus 110. Transistors 501-502 clamp the voltage on the ESD bus 110 to a relatively low voltage (e.g., less than 1 volt) during the ESD event. Transistors 501-502 prevent pin 201 and ESD bus 110 from reaching a high voltage that could damage the input and output circuitry on the integrated circuit. In an embodiment, transistors 501-502 discharge the voltage on ESD bus 110 to a lower voltage than ESD protection circuit 200.

During normal operation, the voltage at node A charges up to supply voltage VCC. The voltage at the gate terminals of transistors 213-214 is at VCC/2 during normal operation, which is large enough to turn on transistors 213-214. Transistors 213-214 discharge node B to voltage VSSIO, which causes transistor 502 to be off. The voltages on the ESD bus 110 and at node C are at or near supply voltage VCC during normal operation. The gate-to-source voltage across each of p-channel transistors 211 and 501 is at or near zero during normal operation, which is large enough to keep transistors 211 and 501 off. Therefore, transistors 501 and 502 are off and are not exposed to high voltages during normal operation. Transistor 212 is off during normal operation, because the source of transistor 212 is floating.

Figure 6:
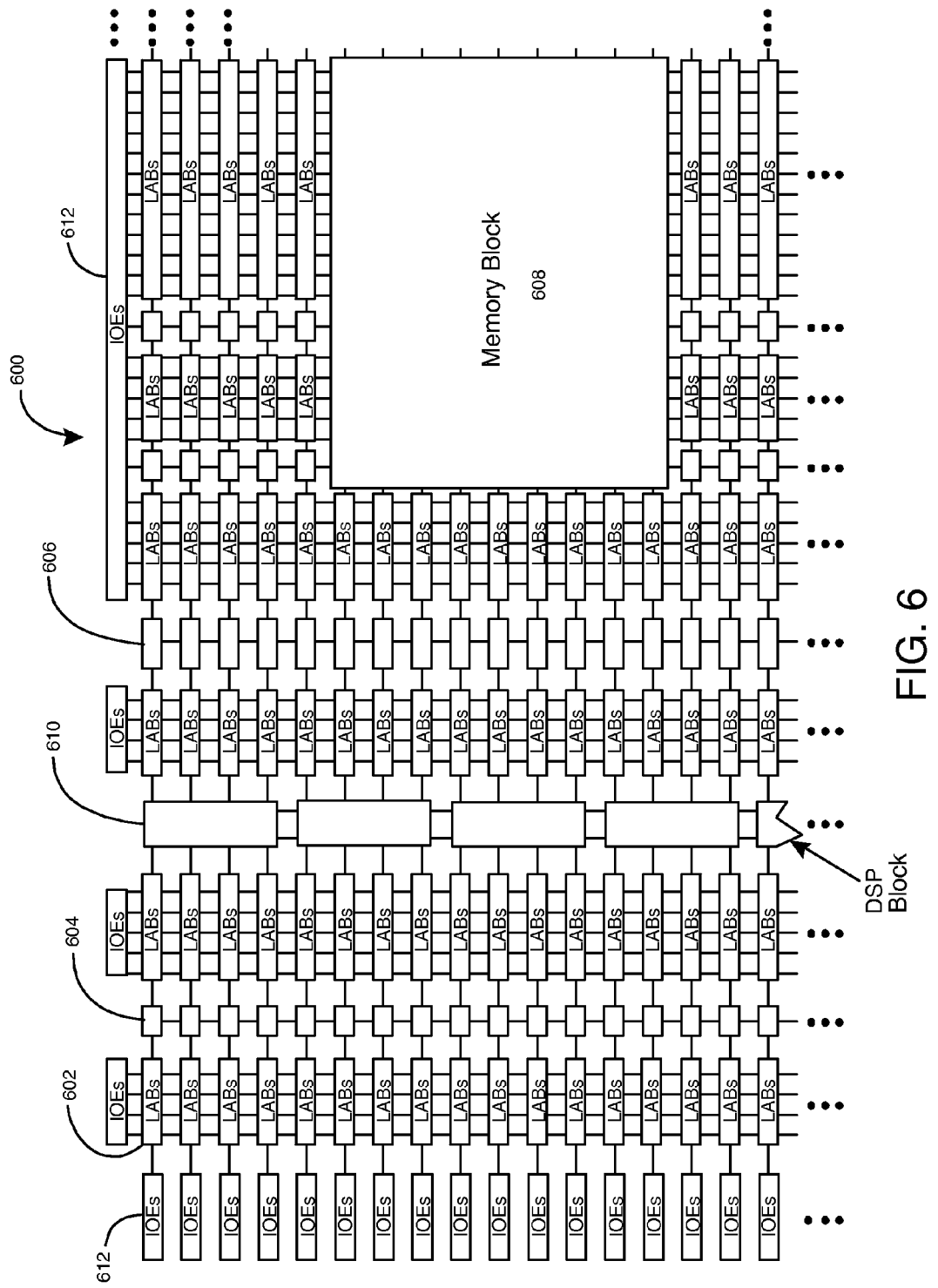
FIG. 6 is a simplified partial block diagram of a field programmable gate array (FPGA) that can include aspects of the present invention.

FIG. 6 is a simplified partial block diagram of a field programmable gate array (FPGA) 600 that can include aspects of the present invention. FPGA 600 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 600 includes a two-dimensional array of programmable logic array blocks (or LABs) 602 that are interconnected by a network of column and row interconnect conductors of varying length and speed. LABs 602 include multiple (e.g., 10) logic elements (or LEs).

A logic element (LE) is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 600 also includes a distributed memory structure including random access memory (RAM) circuit blocks of varying sizes provided throughout the array. The RAM blocks include, for example, blocks 604, blocks 606, and block 608. These memory blocks can also include shift registers and first-in-first-out (FIFO) buffers.

FPGA 600 further includes digital signal processing (DSP) circuit blocks 610 that can implement, for example, multipliers with add or subtract features. Input/output elements (IOEs) 612 support numerous single-ended and differential input/output standards. IOEs 612 include input and output buffers that are coupled to pins of the integrated circuit. The pins are external terminals of the FPGA die that can be used to route, for example, input signals, output signals, and supply voltages between the FPGA and one or more external devices. One or more of IOEs 612 may include ESD protection circuit 200 or 500. One or more of IOEs 612 may include input protection circuit 121. FPGA 600 is described herein for illustrative purposes. Embodiments of the present invention can be implemented in many different types of integrated circuits.

Figure 7:
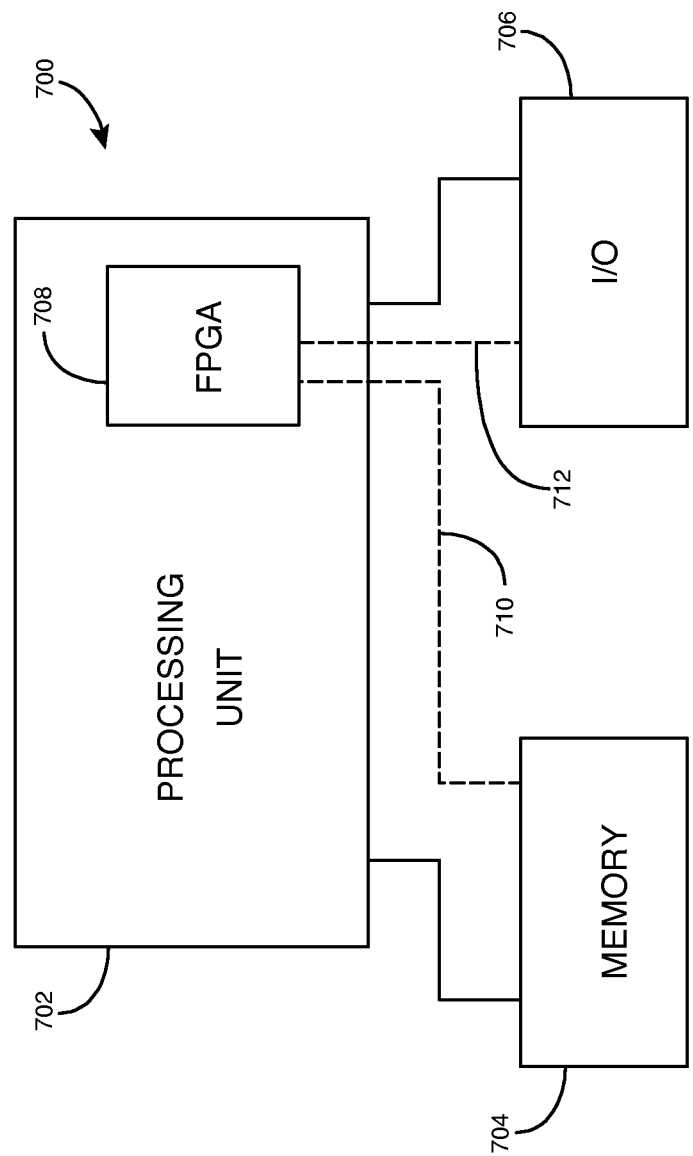
FIG. 7 shows a block diagram of an exemplary digital system that can embody techniques of the present invention.

The present invention can also be implemented in a system that has an FPGA as one of several components. FIG. 7 shows a block diagram of an exemplary digital system 700 that can embody techniques of the present invention. System 700 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 700 can be provided on a single board, on multiple boards, or within multiple enclosures.

System 700 includes a processing unit 702, a memory unit 704, and an input/output (I/O) unit 706 interconnected together by one or more buses. According to this exemplary embodiment, an FPGA 708 is embedded in processing unit 702. FPGA 708 can serve many different purposes within the system of FIG. 7. FPGA 708 can, for example, be a logical building block of processing unit 702, supporting its internal and external operations. FPGA 708 is programmed to implement the logical functions necessary to carry on its particular role in system operation. FPGA 708 can be specially coupled to memory 704 through connection 710 and to I/O unit 706 through connection 712.

Processing unit 702 can direct data to an appropriate system component for processing or storage, execute a program stored in memory 704, receive and transmit data via I/O unit 706, or other similar functions. Processing unit 702 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 708 can control the logical operations of the system. As another example, FPGA 708 acts as a reconfigurable processor that can be reprogrammed as needed to handle a particular computing task. Alternatively, FPGA 708 can itself include an embedded microprocessor. Memory unit 704 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. An electrostatic discharge protection circuit comprising:
   an electrostatic discharge bus;

first and second resistors that are directly connected in series, wherein the first resistor is coupled to the electrostatic discharge bus;

first and second capacitors coupled in series, wherein the first capacitor is coupled to the second resistor;

a first transistor comprising a control input that is directly connected between the first and the second resistors, wherein the first transistor is on during an electrostatic discharge event; and a second transistor comprising a control input that is coupled between the first and the second capacitors, wherein the second transistor is off during the electrostatic discharge event.

2. The electrostatic discharge protection circuit of claim 1 further comprising:
a third transistor coupled between the first transistor and the second transistor, wherein the third transistor comprises a control input that is directly connected to the first and the second resistors.

3. The electrostatic discharge protection circuit of claim 2 further comprising:
a fourth transistor coupled to the second transistor, wherein the fourth transistor comprises a control input that is directly connected to the first and the second capacitors, and wherein the first transistor is coupled to the electrostatic discharge bus.

4. The electrostatic discharge protection circuit of claim 3, wherein the first and the third transistors are p-channel field-effect transistors, and wherein the second and the fourth transistors are n-channel field-effect transistors.

5. The electrostatic discharge protection circuit of claim 1 further comprising:
a silicon-controlled rectifier circuit coupled to the electrostatic discharge bus, wherein the second transistor is coupled to the silicon-controlled rectifier circuit.

6. The electrostatic discharge protection circuit of claim 5 further comprising:
a third transistor coupled to the first transistor and the second transistor, wherein the third transistor comprises a control input that is coupled between the first and the second resistors; and
a fourth transistor coupled in series with the second transistor, wherein the fourth transistor comprises a control input that is coupled between the first and the second capacitors, and wherein the first transistor is coupled to the electrostatic discharge bus.

7. The electrostatic discharge protection circuit of claim 6 further comprising:
an inverter circuit comprising an input coupled to the second and the third transistors and an output coupled to the silicon-controlled rectifier circuit.

8. The electrostatic discharge protection circuit of claim 1 further comprising:
a pin of an integrated circuit, wherein the electrostatic discharge protection circuit is in the integrated circuit; and
a diode coupled between the pin and the electrostatic discharge bus.

9. The electrostatic discharge protection circuit of claim 1 further comprising:
a third transistor coupled to the first transistor and the second transistor, wherein a control input of the third transistor is directly connected to the first and the second resistors;
a fourth transistor coupled in series with the second transistor, wherein a control input of the fourth transistor is directly connected to the first and the second capacitors;

a fifth transistor coupled to the electrostatic discharge bus; and
a sixth transistor coupled to the fifth transistor, wherein a control input of the sixth transistor is coupled between the second and the third transistors.

10. An integrated circuit comprising:
a first transistor comprising a gate terminal coupled to a first pin, wherein a drain of the first transistor is coupled to first and second capacitors;
a second transistor comprising a gate terminal coupled to a source of the first transistor, wherein a source of the second transistor is coupled to a second pin;
a diode coupled between the source of the second transistor and a drain of the second transistor; and
an input circuit coupled to the drain of the second transistor, wherein the diode conducts current between the second pin and the input circuit during an electrostatic discharge event at the second pin.

11. The integrated circuit of claim 10, further comprising:
a resistor coupled between the first capacitor and the first pin, wherein the diode comprises an anode coupled to the source of the second transistor and a cathode coupled to the drain of the second transistor.

12. The integrated circuit of claim 10, wherein the second transistor conducts current from the second pin to the input circuit in response to an input signal at the second pin when a voltage at the first pin is at a nominal operating supply voltage.

13. A circuit comprising:
an electrostatic discharge bus;
a first resistor coupled to the electrostatic discharge bus;
a first transistor coupled to the first resistor;
a first capacitor;
a second transistor coupled to the first capacitor and the first transistor;
third and fourth transistors, wherein the third transistor is coupled to the electrostatic discharge bus and to the fourth transistor; and
a hot socket protection circuit comprising fifth and sixth transistors coupled in series, wherein the fifth transistor is coupled to the first, the second, and the fourth transistors, and wherein the fifth and the sixth transistors turn on in response to a hot socket signal to turn off the fourth transistor.

14. The circuit of claim 13, wherein the third and the fourth transistors are a silicon-controlled rectifier circuit.

15. The circuit of claim 13, wherein a control input of the fourth transistor is coupled to the fifth transistor and to the first and the second transistors.

16. The circuit of claim 13 further comprising:
a second resistor coupled between the first resistor and the first capacitor;
a second capacitor coupled to the first capacitor;
a seventh transistor coupled to the first transistor and the electrostatic discharge bus, wherein control inputs of the first and the seventh transistors are coupled to the first and the second resistors; and
an eighth transistor coupled in series with the second transistor, wherein control inputs of the eighth and the second transistors are coupled to the first and the second capacitors.

17. A method comprising:
drawing current from an electrostatic discharge bus during an electrostatic discharge event through first and second resistors that are directly connected in series;

turning on a first transistor during the electrostatic discharge event, wherein a control input of the first transistor is directly connected between the first and the second resistors;

maintaining a second transistor off during the electrostatic discharge event, wherein a control input of the second transistor is coupled between first and second capacitors, and wherein the first capacitor is coupled to the second resistor; and turning on third and fourth transistors during the electrostatic discharge event to discharge the electrostatic discharge bus, wherein the fourth transistor is coupled to the first, the second, and the third transistors.

18. The method of claim 17, wherein turning on a first transistor during the electrostatic discharge event further comprises turning a fifth transistor on during the electrostatic discharge event, wherein the fifth transistor is coupled to the first transistor and the electrostatic discharge bus, wherein a control input of the fifth transistor is coupled between the first and the second resistors; and wherein maintaining a second transistor off during the electrostatic discharge event further comprises maintaining a sixth transistor off during the electrostatic discharge event by shorting the first and the second capacitors to ground, wherein the sixth transistor is directly connected in series with the second transistor, and wherein a control input of the sixth transistor is directly connected to the first and the second capacitors.

19. The method of claim 17, wherein the third and the fourth transistors are a silicon-controlled rectifier circuit.

20. The method of claim 17, wherein a control input of the fourth transistor is coupled between the first and the second transistors.

* * * * *